(12) United States Patent
Tao

(10) Patent No.: US 9,397,070 B2
(45) Date of Patent: Jul. 19, 2016

(54) METHOD FOR FORMING PACKAGE STRUCTURE

(71) Applicant: Nantong Fujitsu Microelectronics Co., Ltd., Nantong, Jiangsu (CN)

(72) Inventor: Yujuan Tao, Jiangsu (CN)

(73) Assignee: NANTONG FUJITSU MICROELECTRONICS CO., LTD., Nantong, Jiangsu (CN)

( * ) Notice: Subject to any disclaimer, the term of this patent is extended or adjusted under 35 U.S.C. 154(b) by 0 days.

(21) Appl. No.: 14/766,504

(22) PCT Filed: Sep. 17, 2014

(86) PCT No.: PCT/CN2014/086737
§ 371 (c)(1),
(2) Date: Aug. 7, 2015

(87) PCT Pub. No.: WO2015/081746
PCT Pub. Date: Jun. 11, 2015

(65) Prior Publication Data
US 2016/0035696 A1 Feb. 4, 2016

(30) Foreign Application Priority Data
Dec. 5, 2013 (CN) .......................... 2013 1 0653445

(51) Int. Cl.
*H01L 21/00* (2006.01)
*H01L 23/00* (2006.01)
(Continued)

(52) U.S. Cl.
CPC .............. *H01L 24/96* (2013.01); *H01L 21/486* (2013.01); *H01L 21/4853* (2013.01);
(Continued)

(58) Field of Classification Search
None
See application file for complete search history.

(56) References Cited

U.S. PATENT DOCUMENTS 5,672,912 A 9/1997 Aoki et al.
7,838,975 B2 11/2010 Chen
(Continued)

FOREIGN PATENT DOCUMENTS

CN 101276763(A) 10/2008
CN 101593734 A 12/2009
(Continued)

OTHER PUBLICATIONS

International Search Report issued in PCT/CN2014/086737 mailed Nov. 28, 2014.
(Continued)

*Primary Examiner* — Reema Patel
(74) *Attorney, Agent, or Firm* — RatnerPrestia

(57) ABSTRACT

A method for forming a package structure is provided, which includes: providing a pre-packaged panel including a first encapsulation layer, which includes multiple integrating units each including at least one semiconductor chip with multiple first pads, and first metal bumps are disposed on the first pads; providing a circuit board including a first surface and a second surface, where the circuit board includes multiple carrying units each including multiple input pads on the first surface and multiple output pads on the second surface; mounting the pre-packaged panel on the first surface to form multiple package units; forming a filling layer by filling a space between the first surface and the pre-packaged panel; forming second metal bumps on the output pads on the second surface; cutting the structure based on the multiple package units to form multiple independent package structures. Accordingly, the package structure improves package efficiency.

10 Claims, 4 Drawing Sheets

(51) Int. Cl.
*H01L 21/82* (2006.01)
*H01L 21/56* (2006.01)
*H01L 21/48* (2006.01)

(52) U.S. Cl.
CPC .......... *H01L 21/561* (2013.01); *H01L 21/565* (2013.01); *H01L 21/82* (2013.01); *H01L 24/17* (2013.01); *H01L 24/29* (2013.01); *H01L 24/83* (2013.01); *H01L 24/97* (2013.01); *H01L 2224/1301* (2013.01); *H01L 2224/17181* (2013.01); *H01L 2224/29026* (2013.01); *H01L 2224/818* (2013.01); *H01L 2924/014* (2013.01)

(56) References Cited

U.S. PATENT DOCUMENTS

| | | | |
|---|---|---|---|
| 8,409,926 B2 | 4/2013 | Lin et al. | |
| 2008/0242003 A1 | 10/2008 | How et al. | |
| 2011/0278717 A1 | 11/2011 | Pagaila et al. | |
| 2014/0210080 A1* | 7/2014 | Chang | H01L 23/49816 257/738 |
| 2014/0264839 A1* | 9/2014 | Tsai | H01L 23/49816 257/737 |

FOREIGN PATENT DOCUMENTS

| | | |
|---|---|---|
| CN | 102163603(A) | 8/2011 |
| CN | 102194717 A | 9/2011 |
| CN | 102244012(A) | 11/2011 |
| CN | 103745958 A | 4/2014 |
| CN | 103915355 A | 7/2014 |
| JP | 2001072473(A) | 3/2001 |
| JP | 2001-319942 A | 11/2001 |
| JP | 2004087895(A) | 3/2004 |

OTHER PUBLICATIONS

Written Opinion of the International Searching Authority issued in PCT/CN2014/086737 mailed Nov. 28, 2014.
Chinese First Office Action issued in Chinese Patent Application No. 201310653445.5 dated Mar. 21, 2016.

\* cited by examiner

METHOD FOR FORMING PACKAGE STRUCTURE

CROSS-REFERENCE TO RELATED APPLICATIONS

The present application is the U.S. National Phase Application of International Application No. PCT/CN2014/086737, filed on Sep. 17, 2014, which claims priority to Chinese patent application No. 201310653445.5, filed on Dec. 5, 2013, and entitled "METHOD FOR FORMING PACKAGE STRUCTURE", the entire disclosure of which is incorporated herein by reference.

TECHNICAL FIELD

The present disclosure generally relates to semiconductor package field, and more particularly, to a method for forming a package structure.

BACKGROUND

As electronic products, such as mobile phones, laptops, etc, trend to be miniaturized, portable, ultra-thinned, multimedia and low cost satisfying a public requirement, a conventional technique of single semiconductor chip package may not satisfy innovative market requirements, and a package possessing characteristics such as lightness, thinness, shortness and smallness, high precision and low cost becomes popular in market researches. Among various current techniques of package, Package On Package (POP) and Package In Package (PIP) are typical.

For example upon POP, via stacking semiconductor chips on a circuit board, volume and thickness of an entire package structure may be reduced.

However, the current POP technique has a low efficiency.

SUMMARY

This present disclosure may improve efficiency of a package structure.

In order to solve the problem stated hereinbefore, the present disclosure provides a method for forming a package structure. The method may include: providing a pre-packaged panel, including a first encapsulation layer, which includes multiple integrating units arranged in a matrix form, wherein each of the integrating units may include at least one semiconductor chip with multiple first pads, and the first encapsulation layer exposes the first pads and first metal bumps may be disposed on the first pads; providing a circuit board, including a first surface and a second surface opposite to the first surface, where the circuit board may include multiple carrying units arranged in a matrix form, each of which may include multiple input pads on the first surface and multiple output pads on the second surface, where the input pads and the output pads may be interconnected electrically; mounting the pre-packaged panel on the first surface of the circuit board to form multiple package units arranged in a matrix form, where the integrating units of the pre-packaged panel may one-to-one correspond to the carrying units of the circuit board, and the first metal bumps of the pre-packaged panel and the input pads on the first surface of the circuit board may respectively be soldered together; forming a filling layer by filling a space between the first surface of the circuit board and the pre-packaged panel; forming second metal bumps on the output pads on the second surface of the circuit board; cutting the structure based on the multiple package units to form multiple independent package structures.

In some embodiments, forming the pre-packaged panel may include: providing a substrate on which a gluing layer may be disposed, where the gluing layer may include multiple gluing regions arranged in a matrix form; providing multiple semiconductor chips having the first pads; gluing a surface having the first pads of at least one semiconductor chip on each of the gluing regions in the gluing layer; forming a first encapsulation layer encapsulating the multiple semiconductor chips; removing the substrate and the gluing layer so as to expose the first pads of the semiconductor chips; forming first metal bumps on the first pads, and thus the multiple integrating units arranged in a matrix form are formed.

In some embodiments, posterior to removing the substrate and the gluing layer, an integrating layer may be formed on the first encapsulation layer, which may include an input end, an output end and a multi-layer wire electrically connecting the input end and the output end, where the input end may be electrically connected to one of the first pads of the semiconductor chip, and one of the first metal bumps may be disposed on the output end.

In some embodiments, each of the integrating units in the pre-packaged panel may include multiple passive components, where each of the passive components may have a second pad, and a surface having the second pad of one of the passive components may be glued on the gluing layer.

In some embodiments, the second pad of one of the passive components may be electrically connected to the input end of the integrating layer.

In some embodiments, the circuit board may be a printed circuit board, a BT resin substrate or a silicon substrate.

In some embodiments, multiple first through holes may be formed, each of which may be disposed between two neighboring integrating units of the pre-packaged panel and penetrate the first encapsulation layer, and the filling layer may also fill the first through holes.

In some embodiments, multiple second through holes may be formed, each of which may be disposed between two neighboring carrying units of the circuit board and penetrate the circuit board, and the filling layer may also fill the second through holes.

In some embodiments, each of the first metal bumps may be a solder ball or a solder column, or each of the first metal bumps may have a metal column and a solder ball on top of the metal column.

In some embodiments, the method may further include: forming a second encapsulation layer encapsulating the pre-packaged panel, the circuit board and the filling layer, where the second metal bumps disposed on the output pads on the second surface of the circuit board may be exposed by the second encapsulation layer.

The present disclosure further provides a package structure. The package structure may include: a circuit board including a first surface and a second surface opposite to the first surface, where the circuit board may include multiple carrying units arranged in a matrix form, each of which may include multiple input pads on the first surface and multiple output pads on the second surface, where the input pads and the output pads may be interconnected electrically; a pre-packaged panel including a first encapsulation layer, which may include multiple integrating units arranged in a matrix form, wherein each of the integrating units may include at least one semiconductor chip with multiple first pads, the first encapsulation layer exposes the first pads, and first metal bumps are disposed on the first pads; wherein multiple package units arranged in a matrix form may be formed by mounting the pre-packaged panel on the first surface of the circuit board, where the integrating units of the pre-packaged panel may one-to-one correspond to the carrying units of the circuit board, and the first metal bumps of the pre-packaged panel and the input pads on the first surface of the circuit board may be soldered together, respectively; a filling layer filled in a space between the first surface of the circuit board and the pre-packaged panel; and second metal bumps, disposed on the output pads on the second surface of the circuit board.

In some embodiments, each of the first metal bumps may be a solder ball or a solder column, or each of the first metal bumps may include a metal column and a solder ball on top of the metal column.

In some embodiments, each of the integrating units in the pre-packaged panel may include multiple passive components, where each of the passive components may include a second pad exposed by the first encapsulation layer, and each of the passive components may be disposed aside the semiconductor chip in one of the integrating units.

In some embodiments, the package structure may further include: a first integrating layer formed on the first encapsulation layer, where the first integrating layer may electrically connect one of the first pads of the semiconductor chip in each of the integrating units and the second pad of neighboring one of the passive components together, and one of the first metal bumps may be disposed on the integrating layer.

In some embodiments, if each of the integrating units includes more than one semiconductor chips, a second integrating layer is formed on the first encapsulation layer, where the second integrating layer may electrically connect the first pads of neighboring semiconductor chips in the integrating units together.

In some embodiments, if each of the integrating units includes more than one semiconductor chips, the more than one semiconductor chips may be either same or different.

In some embodiments, the circuit board may be a printed circuit board, a BT resin substrate or a silicon substrate.

In some embodiments, multiple first through holes may be formed, each of which may be disposed between two neighboring integrating units of the pre-packaged panel and penetrate the first encapsulation layer, and the filling layer may also fill the first through holes.

In some embodiments, multiple second through holes may be formed, each of which may be disposed between two neighboring carrying units of the circuit board and penetrate the circuit board, and the filling layer may also fill the second through holes.

In some embodiments, the package structure may further include: a second encapsulation layer encapsulating the pre-packaged panel, the circuit board and the filling layer, where the second metal bumps disposed on the output pads of the circuit board may be exposed by the second encapsulation layer.

Embodiments of the present disclosure possess the following advantages:

The package structure in the present disclosure may include the pre-packaged panel including multiple semiconductor chips, and the pre-packaged panel may be mounted on the first surface of the circuit board; the first metal bumps disposed on the first pads of the semiconductor chips included in the pre-packed panel may be welded with the input pads on the first surface of the circuit board; the filling layer may be formed by filling the space between the first surface of the circuit board and the pre-packaged panel; the second metal bumps may be formed on the output pads on the second surface of the circuit board. Thus, multiple semiconductor chips and the circuit board may be packaged together. Via cutting the first encapsulation layer between two neighboring semiconductor chips, the insulative layer between two neighboring semiconductor chips, the filling layer between two neighboring semiconductor chips and a region between two neighboring carrying units of the circuit board, the multiple independent package structure may be formed. Compared to package a single semiconductor chip with a corresponding circuit board, the present disclosure realizes that packaging multiple semiconductor chips and the circuit board together so as to improve package efficiency.

Further, via packaging the passive components and the multiple semiconductor chips together and electrically connecting the first pads of the multiple semiconductor chips with the second pads of the passive components through the first integrating layer, the entire structure including the multiple semiconductor chips, the passive components and the circuit board may be realized so as to improve package efficiency and satisfy systematic level package requirements.

Further, the first through holes may be formed, each of which may be disposed between two neighboring integrating units of the pre-packaged panel and penetrate the first encapsulation layer. During a package process, the first through holes, on one hand, may release stress accumulated in the pre-packaged panel to reduce warping effect of the pre-packaged panel. On another hand, when mounting the pre-packaged panel onto the first surface of the circuit board, the first metal bumps disposed on the multiple semiconductor chips of the pre-packaged panel and the input pads on the first surface of the circuit board may be soldered together and the filling layer may be formed by filling the space between the first surface of the circuit board and the pre-packaged panel. Since the first through holes in the pre-packaged panel are connected to the space between the first surface of the circuit board and the pre-packaged panel, the first through holes may be helping for air discharge while the filling layer is filled by a filling material. Therefore, fluidity of the filling material can be improved, so as to prevent generating air gaps in the filling layer. Further, the first through holes disposed between two neighboring integrating units and penetrating the first encapsulation layer may not occupy extra space. Further, when the filling layer is formed, the filling layer may completely fill into the first through holes to form a structure like a plug, so that the carrying units and the integrating units may be one-to-one correspondent so as to avoid position deviation and bad welding.

Further, the second through holes may be formed, each of which may be disposed in a region (cutting region) between two neighboring carrying units and penetrate the circuit board. While package is ongoing, on one hand, when mounting the pre-packaged panel on the first surface of the circuit board, the first metal bumps disposed on the multiple semiconductor chips of the pre-packaged panel and the input pads on the first surface of the circuit board may be soldered together, and since the second through holes may be connected with the space between the first surface of the circuit board and the pre-packaged panel, the second through holes may be helping for air discharge while the filling layer is being formed between the first surface and the pre-packaged panel using a filling material, and improve fluidity of the filling material so as to prevent generating air gaps in the filling layer; in another hand, the second through holes and the neighboring carrying units may be fixed in position (or the second through holes and the output pads between the neighboring carrying units may be fixed in position), and the second through holes may serve as calibration marks while the pre-packaged panel is mounted on the circuit board, where, via detecting the calibration marks, the pre-packaged panel may be accurately mounted on the circuit board so as to realize that the first metal bumps of the pre-packaged panel and the input pads of the circuit board may be accurately soldered together. Further, the second through holes may be disposed between two neighboring carrying units (cutting region), which may not occupy extra area.

DETAILED DESCRIPTION

Current POP techniques stack a single semiconductor chip on a circuit board, which possesses a low efficiency.

Therefore, the present disclosure provides a method for forming a package structure including: forming a pre-packed panel, which may include multiple semiconductor chips; welding the semiconductor chips with multiple input pads of a circuit board respectively via metal bumps. Thus, the multiple semiconductor chips and the circuit board packaged together may be realized so as to improve package efficiency.

In order to clarify the objects, characteristics and advantages of the present disclosure, embodiments of the present disclosure will be described in detail in conjunction with the accompanying drawings. The figures are not drawn to scale, and the emphasis is to illustrate the disclosure instead. It will be understood by those skilled in the art that various changes may be made without departing from the spirit or scope of the disclosure. Furthermore, in actual manufacture, three dimensional sizes including length, width and depth are considered.

FIGS. 1 to 11 schematically illustrate structural diagrams for presenting a procedure for forming a package structure according to embodiments of the present disclosure.

Figure 1:
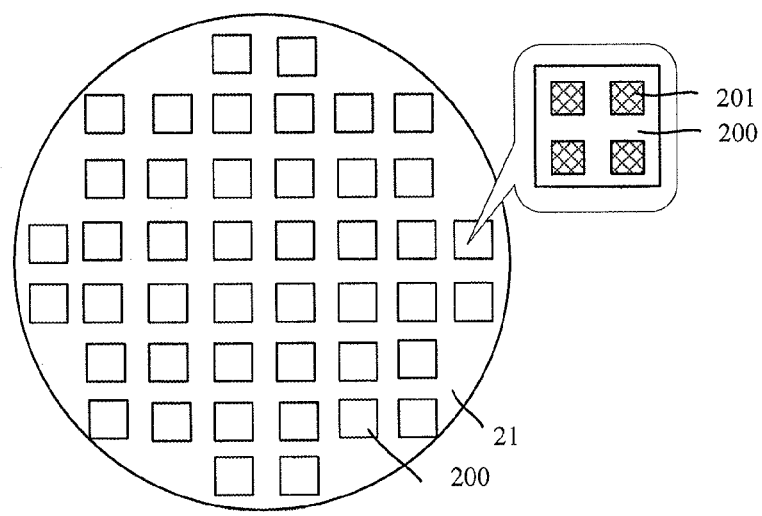
FIGS. 1 to 11 schematically illustrate structural diagrams for presenting a procedure for forming a package structure according to embodiments of the present disclosure.
Figure 2:
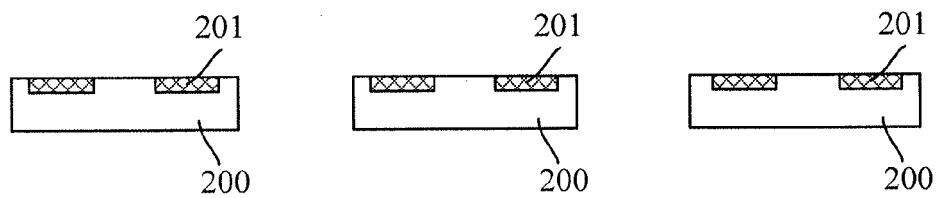

Referring to FIGS. 1 and 2, a wafer 21 is provided, and multiple semiconductor chips 200 are formed on the wafer 21; the wafer 21 is cut into multiple independent semiconductor chips 200.

Each of the semiconductor chips 200 includes integrated circuits (not shown) and multiple first pads 201 on a surface, and the first pads 201 on the surface of the semiconductor chips 200 is electrically connected to the integrated circuits in the semiconductor chips 200. The first pads 201 serve as terminals for electrically connecting the integrated circuits in the semiconductor chips 200 to an external object. The independent semiconductor chips 200 may be packaged together to form a pre-packaged panel.

Specifically, the first pads 201 may be formed by forming an integrating layer on the semiconductor chips 200.

Figure 3:
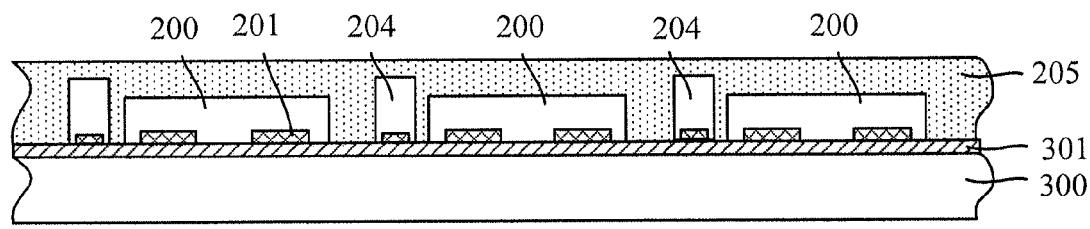

Referring to FIG. 3, the multiple semiconductor chips 200 are packaged together via a first encapsulation layer 205, and the first pads 201 on the semiconductor chips 200 are exposed by the first encapsulation layer 205.

In this embodiment, the semiconductor chips 200 and passive components 204 may be packaged together via the first encapsulation layer 205, and each of the passive components 204 may possess a second pad on a surface. The passive components 204 may be inductances, capacitances or impedances.

Packaging the semiconductor chips 200 and the passive components 204 may include: providing a substrate 300; forming a gluing layer 301 on the substrate 300, which may include multiple gluing regions arranged in a matrix form; gluing at least one of the semiconductor chips 200 in each of the gluing regions in the gluing layer 301 with the surface having the first pads 201 facing the gluing layer 301, and gluing the passive components 204 in the gluing regions in the gluing layer 301 with the surface having the second pad facing the gluing layer 301, where the passive components 204 may be disposed beside the semiconductor chips 200; forming the first encapsulation layer 205 to package the semiconductor chips 200 and the passive components 204 together; removing the substrate 300 and the gluing layer 301 after forming the first encapsulation layer 205 to expose the first pads 201 of the semiconductor chips 200 and the second pads of the passive components 204.

The semiconductor chips 200 are packaged together via the first encapsulation layer 205 to form a pre-packaged panel, which includes multiple integrating units (not labeled) arranged in a matrix form, where the integrating units may correspond in position to the gluing regions in the gluing layer 301 respectively, and the semiconductor chips glued in each of the gluing regions in the gluing layer 301 become the semiconductor chips integrated in each of the integrating units of the pre-packed panel. A region between two neighboring integrating units of the pre-packaged panel is a cutting region.

Each of the gluing regions in the gluing layer 301 may include at least one of the semiconductor chips 200, If more than one semiconductor chips 200 are included in each of the gluing regions, the more than one semiconductor chips 200 may be either same or different. Correspondingly, each of the integrating units on the pre-packaged panel may have at least one of the semiconductor chips 200. If the more than one semiconductor chips 200 are included in each of the integrating units, the more than one semiconductor chips 200 may be either same or different.

The substrate 300 may be a glass substrate, a silicon substrate or a metal substrate.

The gluing layer 301 may be made of various materials, and in one embodiment of the present disclosure, the gluing layer 301 may be made of UV glue. The UV glue is a gluing material generating a reaction to ultraviolet with a special wavelength. According to viscidity of the UV glue after exposure to ultraviolet, the UV glue is classified into two categories that: a solid UV glue, where after exposure to ultraviolet, a light trigger or a photosencitizer in a material absorbs the ultraviolet to generate active free radicals or cations and cause monomer polymer, crosslinked and grafting chemical reactions to make the solid UV glue transform from liquid to solid in a short time so as to be glued with a surface of a touched object; the other UV glue possesses a high viscosity before exposure to ultraviolet, and inversely, viscidity of the UV glue reduces or is faded away once exposure to ultraviolet, which breaks crosslinked chemical bond. The gluing layer 301 in this embodiment uses the second UV glue. In some embodiments, the gluing layer 301 may use other glues, such as thermal degradation glue.

A method for forming the gluing layer 301 on the substrate 300 may be spin coating, printing, etc, which overlays the gluing layer 301 on the substrate 300. These arts are well understood by those skilled in the art and not further specified here.

The first encapsulation layer 205 may be made of a resin selected from a group including epoxide resin, polyimide resin, benzocyclobutene resin and polybenzoxazole resin; the resin may further be polybutylene terephthalate, polycarbonate, polyethylene terephthalate, polyethylene, polypropylene, polyolefin, polyurethane, polyether, polyamide, polyurethane, ethylene-vinylacetate copolymer or poval; the first encapsulation layer 205 may be made of other suitable plastic materials.

The first encapsulation layer 205 may be formed using an art selected from a group including injection molding, transfer molding and printing. The first encapsulation layer 205 may use other arts.

Figure 4:
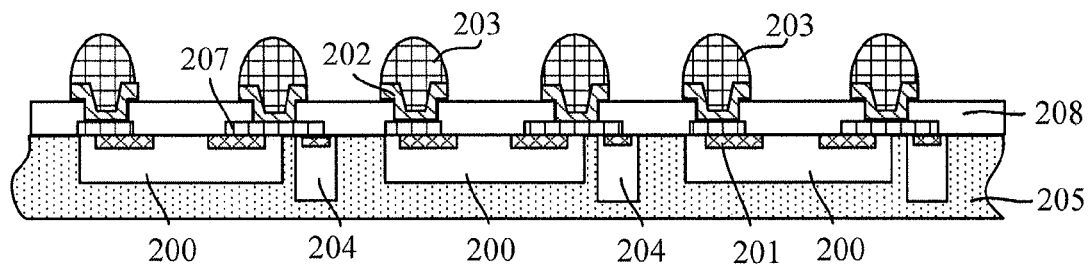

Referring to FIG. 4, first metal bumps 203 are formed on the first pads 201 of the semiconductor chips 200 in each of the integrating units of the pre-packaged panel, where the first metal bumps 203 are consider as a part of the integrating units.

After removing the substrate and the gluing layer, an integrating layer may be formed on the first encapsulation layer, where the integrating layer may include an input end, an output end and a multi-layer wire electrically connecting the input end and the output end, wherein the input end may electrically connected to the first pads of the semiconductor chips; one of the first metal bumps may be formed on the output end.

In this embodiment, the integrating units include passive components 204. Before forming the first metal bumps 203, an integrating layer 207 may be formed on the first encapsulation layer 205, which may electrically connects a part of the first pads 201 of the semiconductor chips 200 and the second pad of neighboring one of passive components 204 together, and one of the first metal bumps 203 may be formed on the integrating layer 207. In this embodiment, the integrating layer 207 has a structure of single metal layer. In some embodiments, the integrating layer 207 may have other structures.

Each of the first metal bumps 203 may be a solder ball or a solder column. In some embodiments, each of the first metal bumps 203 may include a metal column and a solder ball on top of the metal column. The metal column may be made of a metal selected from a group including: aluminum, nickel, tungsten, platinum, copper, titanium, chromium, tantalum, tin alloy, gold and silver. The solder ball may be made of tin or tin alloy, where the tin alloy may include one or more metals selected from a group including tin silver, tin lead, tin silver copper, tin silver zinc, tin zinc, tin bismuth indium, tin indium, tin gold, tin copper, tin zinc indium and tin silver antimony.

In this embodiment, forming the first metal bumps 203 may include: forming an insulative layer 208 covering the first encapsulation layer 205, the semiconductor chips 200, the first pads 201 and the integrating layer 207, and the insulative layer 208 may include a first opening exposing a part of the first pads 201 and partial surface of the integrating layer 207; forming a conductive metal layer on the insulative layer 208, side wall and bottom of the first opening; forming photoresist mask on the conductive metal layer; the photoresist mask may include a second opening exposing the conductive metal layer on the first opening; filling solder layer in the second opening using electroplating; removing the photoresist mask; etching to remove the conductive metal layer on both sides of the solder layer and forming a under bump metal layer 202 on bottom of the solder layer; reflowing the solder layer to form the first metal bumps 203.

In some embodiments, an integrating layer electrically connecting with a pad and a metal layer may be formed on the insulative layer, and a metal bump may be formed on the integrating layer. Connecting points derived from the pad may be re-allocated via forming the integrating layer.

After forming the first metal bumps 203 on the first pads 201, the entire pre-packaged panel may be formed. The pre-packaged panel may include the first encapsulation layer including the integrating units arranged in a matrix form, each of which may have at least one of the semiconductor chips 200, which may include the first pads 201, and the first metal bumps 203 may be disposed on the first pads 201. The pre-packaged panel may integrate the passive components 204 to realize that the semiconductor chips 200 and the passive components 204 may be packaged together in a systematic level.

Via packaging the semiconductor chips 200 and the passive components 204 together, the pre-package panel may be formed, and the pre-packaged panel may be mounted on the first surface of the circuit board, where the integrating units of the pre-packaged panel may one-to-one correspond to the carrying units of the circuit board, and the first metal bumps 203 of the pre-packaged panel and the input pads on the first surface of the circuit board may be soldered together. The method for forming the package structure in the present disclosure realizes the semiconductor chips 200, the passive components and the circuit board may be packaged together to improve package efficiency.

In some embodiments, after forming the pre-packaged panel, multiple first through holes may be formed, each of which may be disposed between two neighboring integrating units of the pre-packaged panel and penetrate the first encapsulation layer, and in this embodiment, the first through holes may further penetrate the corresponding insulative layer between neighboring metal bumps. The first through holes, on one hand, may release stress accumulated in the pre-packaged panel to reduce warping effect of the pre-packaged panel; on another hand, when the pre-packaged panel is mounted on the first surface of the circuit board, the first metal bumps disposed on the semiconductor chips of the pre-packaged panel and the input pads on the first surface of the circuit board may be soldered together and the filling layer may be formed by filling the space between the first surface of the circuit board and the pre-packaged panel. Since the first through holes in the pre-packaged panel and the space between the first surface of the circuit board and the pre-packaged panel may be connected, it may be helping for air discharge while the filling layer is filled using a filling material, and improve fluidity of the filling material so as to prevent generating air gaps in the filling layer. Further, the first through holes disposed between two neighboring integrating units and penetrating the first encapsulation layer may not occupy extra space. Further, when the filling layer is formed, the filling layer may fill the first through holes, and the filling layer and the first through holes may form a structure like a plug so that the carrying units and the integrating units may be one-to-one correspondent so as to avoid position deviation and bad welding. The first through holes may be formed using punching or drilling. In some embodiments, when the first encapsulation layer is formed using injection molding or printing, a place needed for forming one of the first through holes may be covered by a part of a printing screen or a mold; after the first encapsulation layer is formed, the printing screen or the mold may be removed, the first through holes may be formed directly, where each of the first through holes may be disposed between two neighboring integrating units of the pre-packaged panel and penetrate the first encapsulation layer, and the insulative layer covering the first through holes may be removed by etching or exposing.

Figure 5:
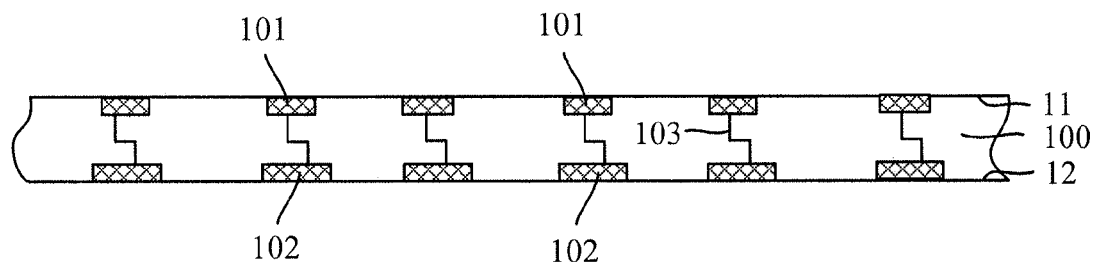

Referring to FIG. 5, a circuit board 100 is provided, which includes a first surface 11 and a second surface 12 opposite to the first surface 11; the circuit board 100 includes multiple carrying units (not labeled) arranged in a matrix form, where the carrying unit includes multiple input pads 101 on the first surface 11 and multiple output pads 102 on the second surface 12, and each of the input pads 101 and each of the output pads 102 are interconnected electrically by an interconnector 103 in each of the carrying units; a region between two neighboring carrying units on the circuit board 100 is a cutting region.

The circuit board 100 may include the carrying units arranged in a matrix form, and the carrying units may one-to-one correspond to the integrating units arranged in a matrix form of the pre-packaged panel. While package is ongoing, the pre-packaged panel may be mounted on the circuit board, the integrating units may be on top of the carrying units, and the first metal bumps of the integrating units and the input pads of corresponding carrying units may respectively be soldered together so as to realize that the first metal bumps 203 of the integrating units and the input pads 101 of the carrying units may be accurately welded, respectively.

The circuit board 100 may be printed circuit board, Bismaleimide Triazine (BT), resin substrate or silicon substrate.

The circuit board 100 may be either a single-layer structure or a multiple-layer structure, and correspondingly, the interconnector 103 may be either a single-layer structure or a multiple-layer structure. If the interconnector 103 is a multiple-layer structure, the interconnector 103 may include multiple metal layers and a jack plug electrically connecting two neighboring metal layers.

The second through holes may be formed, each of which may be disposed in a region (cutting region) between two neighboring carrying units and may penetrate the circuit board 100. While package is ongoing, on one hand, when the pre-packaged panel is mounted on the first surface of the circuit board, the first metal bumps disposed on the semiconductor chips of the pre-packaged panel and the input pads on the first surface of the circuit board may be respectively soldered together, and due to the second through holes are connected with the space between the first surface of the circuit board and the pre-packaged panel, the second through holes may be helping for air discharge while the filling layer between the first surface and the pre-packaged panel is filled using a filling material and improve fluidity of the filling material so as to prevent generating air gaps in the filling layer. Further, the second through holes and the neighboring carrying units are fixed in position (or the second through holes and the output pads of the neighboring carrying units are fixed in position), and the second through holes may serve as calibration marks while mounting the pre-packaged panel on the circuit board, where, via detecting the calibration marks, the pre-packaged panel may be accurately mounted on the circuit board so as to realize that the first metal bumps of the pre-packaged panel and the input pads of the circuit board may be accurately soldered together. Further, the second through holes may be disposed between two neighboring carrying units (cutting region), which may not occupy extra area. The second through holes may be formed by punching, drilling or pressing. The second through holes may be formed further by etching.

Figure 6:
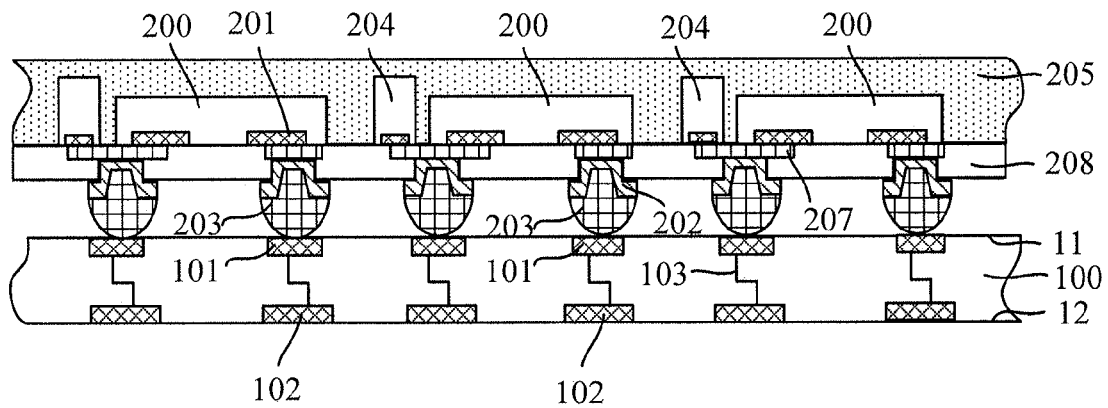
Figure 7:
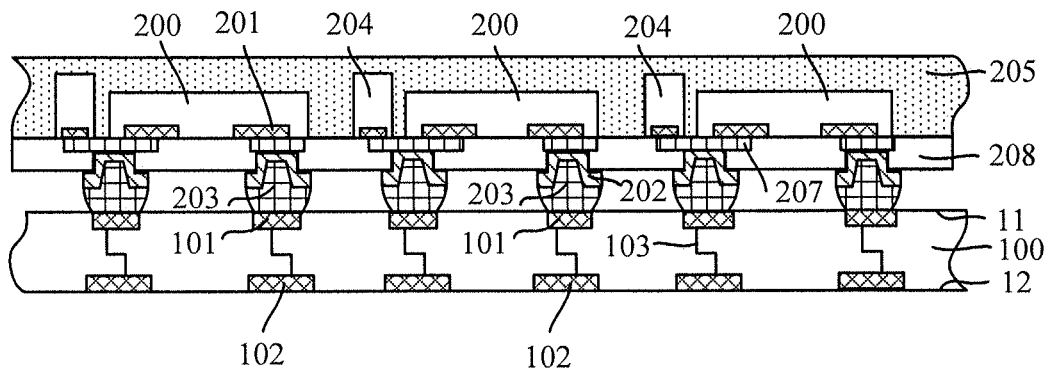

Referring to FIGS. 6 and 7, the pre-packaged panel is mounted on the first surface 11 of the circuit board 100, where the integrating units of the pre-packaged panel one-to-one correspond to the carrying units of the circuit board, and the first metal bumps 203 disposed on the semiconductor chips 200 of the integrating units and the input pads 101 of the carrying units on the first surface 11 are soldered together to form multiple package units arranged in a matrix form, each of which may include one of the integrating units and corresponding one of the carrying units.

In this embodiment, the pre-packaged panel may be mounted on the first surface 11 of the circuit board 100, and the first metal bumps 203 disposed on the first pads 201 of the semiconductor chips 200 may contact with the input pads 101 on the first surface 11 of the circuit board 100. Via reflowing, the first metal bumps 203 and the input pads 101 on the first surface 11 of the circuit board 100 may be soldered together.

Figure 8:
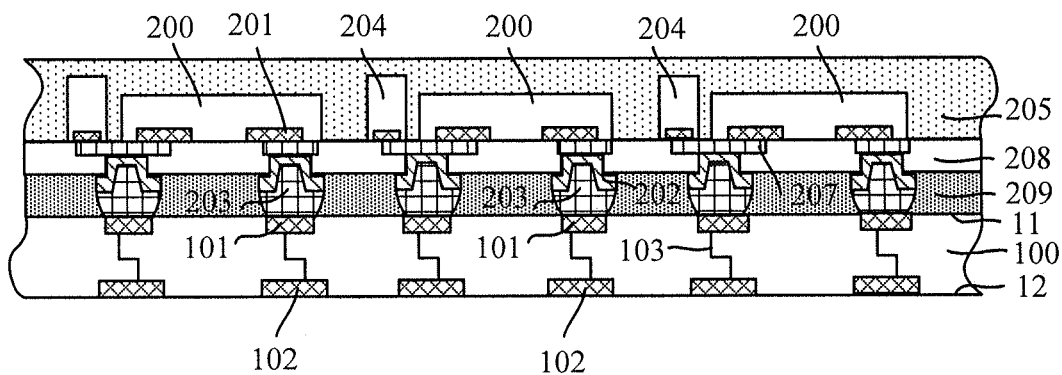

Referring to FIG. 8, a filling layer 209 is formed by filling a space between the first surface 11 of the circuit board 100 and the pre-packaged panel.

The filling layer 209 may be made of a resin, which has high fluidity, small volume and low viscosity, selected from a group including epoxide resin, polyimide resin, benzocyclobutene resin and polybenzoxazole resin. And, the filling layer 209 may be made of other materials.

Forming the filling layer 209 may use injection molding, transfer molding or others. Due to buffering by the first metal bumps 203, a space between the pre-packaged panel and the first surface 11 may be enlarged so as to achieve a higher fluidity and prevent defects such as air gaps while forming the filling layer 209.

In some embodiments, when the first through holes are formed, each of which may be disposed between two neighboring integrating units of the pre-packaged panel and penetrate the first encapsulation layer and the insulative layer. Since the first through holes in the pre-packaged panel are connected to the space between the first surface of the circuit board 100 and the pre-packaged panel, fluidity of the filling material can be improved so as to prevent generating air gaps in the filling layer.

Figure 9:
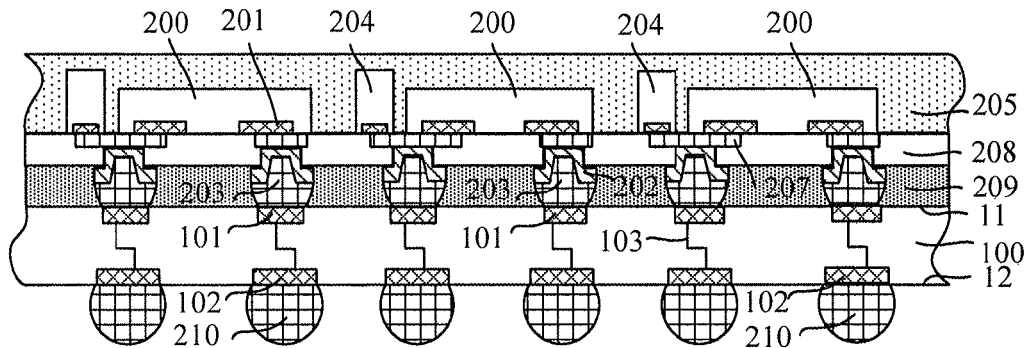

Referring to FIG. 9, second metal bumps 210 are formed on the output pads 102 of the carrying units, which are on the second surface 12 of the circuit board 100.

Each of the second metal bumps 210 may be a solder ball. The second metal bumps 210 may be formed using printing and reflowing. The second metal bumps 210 may be formed further using electroplating and reflowing. In some embodiments, each of the second metal bumps may further include a metal column and a solder ball on top of the metal column.

In this embodiment, re-allocation of output points derived from the first pads of the semiconductor chips may be realized via the circuit board 100, which may reduce the output points derived from the first pads of the semiconductor chips in density. The second metal bumps 210 may be larger than the first metal bumps 203 in size.

In some embodiments, further including: forming a second encapsulation layer to encapsulate the pre-packaged panel, the circuit board and the filling layer, where the second encapsulation layer may expose the second metal bumps disposed on the output pads of the carrying units on the second surface.

The method for forming the package structure in the present disclosure, after the pre-packaged panel including the multiple semiconductor chips 200 is formed, the pre-packaged panel may be mounted on the first surface 11 of the circuit board 100; the first metal bumps 203 of the semiconductor chips 200 and the first pads 101 on the first surface 11 of the circuit board 100 may respectively be welded together; the filling layer 209 may be formed by filling the space between the pre-packaged panel and the first surface 11 of the circuit board 100; the second metal bumps 210 may be disposed on the output pads 102 on the second surface 12 of the circuit board 100; the semiconductor chips 200 and the circuit board packaged together may be realized. Via cutting and removing the first encapsulation layer 205 between two neighboring semiconductor chips 200, the insulative layer 208 between two neighboring semiconductor chips 200, the filling layer 209 between two neighboring semiconductor chips 200 and a region between two neighboring carrying units of the circuit board, multiple independent package structures may be formed. Compared to packaging a single semiconductor chip with a corresponding circuit board, the method for forming the package structure improves package efficiency.

Figure 10:
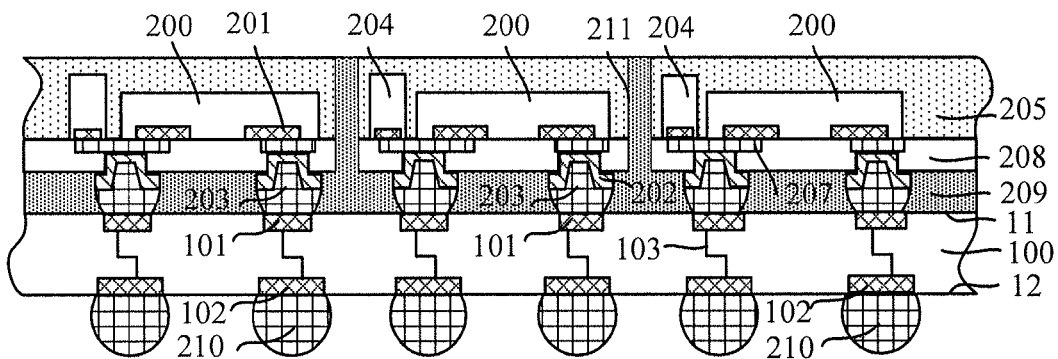

In another embodiment, referring to FIG. 10, multiple first through holes 211 are formed between neighboring integrating units of the pre-packaged panel and penetrate the first encapsulation layer 205 and the insulative layer 208; when the pre-packaged panel is mounted on the first surface 11 of the circuit board 100, the first metal bumps 203 of the semiconductor chips 200 and the first pads 101 on the first surface 11 of the circuit board 100 may respectively be welded together; the filling layer 209 may be formed by filling the space between the pre-packaged panel and the first surface 11 of the circuit board 100, and due to the first through holes 211 in the pre-packaged panel and the space between the first surface 11 of the circuit board 100 and the pre-packaged panel may be connected, the first through holes 211 may be helping for air discharge while filling the filling layer using a filling material, and improve fluidity of the filling material so as to prevent generating air gaps in the filling layer. In this embodiment, when forming the filling layer 209, the filling layer 209 may also fill the first through holes 211. In some embodiments, the filling layer may or may not fill the first through holes. After the filling layer is formed, the second metal bumps 210 may be formed on the output pads 102 of the circuit board 100.

In another embodiment, multiple second through holes may be formed, each of which may be disposed in a region (cutting region) between two neighboring carrying units and may penetrate the circuit board. Due to the second through holes may be connected with the space between the first surface of the circuit board and the pre-packaged panel, fluidity of the filling material may be improved so as to prevent generating air gaps in the filling layer. After the filling layer is formed, the second metal bumps 210 may be formed on the output pads 102 of the circuit board 100.

Figure 11:
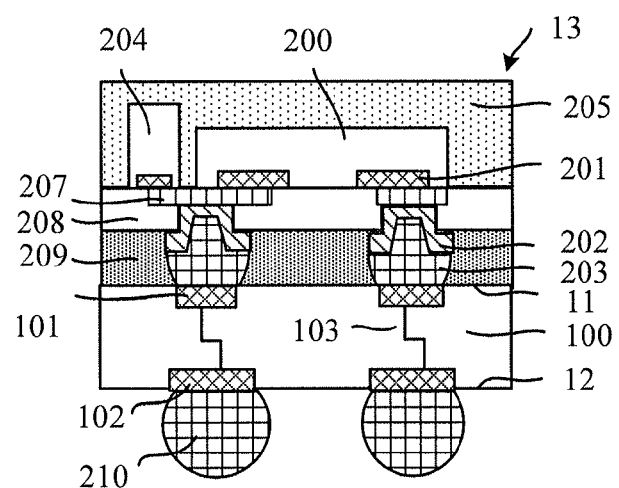

Referring to FIGS. 9 and 11, the package structure is cut based on the package units to form multiple independent package structures 13.

The independent package structures 13 may be formed by cutting the first encapsulation layer 205 and the filling layer 209 at a region between neighboring integrating units and cutting the circuit board 100 at a region between neighboring carrying units. In this embodiment, after cutting the first encapsulation layer at a region between neighboring integrating units, the insulative layer 208 may also be cut.

Each of the independent package structures 13 may include: a semiconductor chip 200 including multiple first pads 201; a first encapsulation layer 205 encapsulating the semiconductor chip 200 and exposing the first pads 201; the semiconductor chip 200 is mounted on a circuit board 100, which include a first surface 11 and a second surface 12 opposite to the first surface 11, where the first surface 11 of the circuit board 100 includes multiple input pads 101 and the second surface 12 includes multiple output pads 102; wherein the first pads 201 of the semiconductor chip 200 are electrically connected to the input pads 101 of the circuit board 100 respectively via first metal bumps 203; a filling layer is formed by filling a space between the first pads 201 of the semiconductor chip 200 and the first surface 11 of the circuit board 100; second metal bumps are disposed on the output pads 102 of the circuit board 100. Each of the independent package structures 13 further includes a passive component 204, which is encapsulated in the first encapsulation layer 205, where a second pad of the passive component 204 and one of the first pads 201 of the semiconductor chip 200 are electrically connected via an integrating layer 207. An insulative layer may be formed between the first encapsulation layer and the filling layer 209, which includes an opening exposing a surface of the integrating layer 207, where a under bump metal layer 202 is formed inside the opening and on a part of the insulative layer, and the under bump metal layer 202 is electrically connected to one of the first metal bumps 203.

The present disclosure further provides a package structure. Referring to FIG. 9, the package structure may include: a circuit board 100 including a first surface 11 and a second surface 12 opposite to the first surface 11, where the circuit board 100 may include multiple carrying units arranged in a matrix form, and each of the carrying units may include multiple input pads 101 on the first surface 11 and multiple output pads 102 on the second surface 12, where the input pads 101 and the output pads 102 may be interconnected electrically by multiple interconnectors 103; a pre-packaged panel including a first encapsulation layer 205, which may include multiple integrating units arranged in a matrix form, and each of the integrating units may include at least one semiconductor chip 200 with multiple first pads 201 exposed outside the first encapsulation layer 205, where first metal bumps 203 may be disposed on the first pads 201; wherein multiple package units arranged in a matrix form may be formed by mounting the pre-packaged panel on the first surface 11 of the circuit board 100, where the integrating units of the pre-packaged panel one-to-one correspond to the carrying units of the circuit board 100 respectively, and the first metal bumps 203 of the pre-packaged panel and the input pads 101 of the carrying units on the first surface 11 are soldered together; a filling layer 209 formed by filling a space between the first surface 11 and the pre-packaged panel; second metal bumps 210 disposed on the output pads 102 of the carrying units on the second surface 12.

Specifically, an integrating layer may be formed on the first encapsulation layer, which may include an input end, an output end and a multi-layer wire electrically connecting the input end and the output end, where the input end may be electrically connected to one of the first pads of the semiconductor chip, and one of the first metal bumps may be disposed on the output end.

In this embodiment, each of the integrating units of the pre-packaged panel may include multiple passive components. Before the first metal bumps 203 may be formed, the integrating layer 207 may be formed on the first encapsulation layer 205, which may electrically connect a second pad of one of the passive components to the input end of the integrating layer, and the first metal bumps 203 may be formed on the integrating layer 207. In this embodiment, for demonstration only, the integrating layer may be a single-layer structure. In some embodiments, the integrating layer may be other structures.

In some embodiments, if each of the integrating units includes more than one semiconductor chips, a second integrating layer may be formed on the first encapsulation layer, where the second integrating layer may electrically connect the first pads of neighboring semiconductor chips in the integrating units together, and one of the first metal bumps may be disposed on the second integrating layer.

If each of the integrating units includes more than one semiconductor chips, the more than one semiconductor chips may be either same or different.

Each of the first metal bumps 203 may include a solder ball or a solder column, or each of the first metal bumps may include a metal column and a solder ball on top of the metal column.

The circuit board 100 may be a printed circuit board, a BT resin substrate or a silicon substrate.

The circuit board 100 may be either a single-layer structure or a multi-layer structure; the interconnector 103 may be either a single-layer structure or a multi-layer structure.

Each of the second metal bumps 210 may include a solder ball, or each of the second metal bumps may include a metal column and a solder ball on top of the metal column.

The second metal bumps 210 may be larger in size than the first metal bumps 203.

The insulative layer 208 may cover the first encapsulation layer 205, and the insulative layer 208 may include an opening exposing the integrating layer 207. The under bump metal layer 202 may be disposed inside the opening and on a part of the insulative layer 208, and the under bump metal layer 202 may electrically connect one of the first metal bumps 203 to the integrating layer 207.

In some embodiments, multiple first through holes may be formed, each of which may be disposed between two neighboring semiconductor chips of the pre-packaged panel and penetrate the first encapsulation layer, and the filling layer may fill the first through holes.

In some embodiments, multiple second through holes may be formed, each of which may be disposed between two neighboring carrying units of the circuit board and penetrate the circuit board, and the filling layer may fill the second through holes.

In some embodiments, the package structure may further include a second encapsulation layer encapsulating the pre-packaged panel, the circuit board and the filling layer, where the second metal bumps disposed on the output pads of the circuit board are exposed by the second encapsulation layer.

The disclosure is disclosed, but not limited, by preferred embodiments as above. Based on the disclosure of the disclosure, those skilled in the art can make any variation and modification without departing from the scope of the disclosure. Therefore, any simple modification, variation and polishing based on the embodiments described herein is within the scope of the present disclosure.

What is claimed is:

1. A method for forming a package structure, comprising:
    providing a pre-packaged panel comprising a first encapsulation layer, which comprises a plurality of integrating units arranged in a matrix form, wherein each of the integrating units comprises at least one semiconductor chip with a plurality of first pads, and the first encapsulation layer exposes the first pads and first metal bumps are disposed on the first pads;
    providing a circuit board comprising a first surface and a second surface opposite to the first surface, where the circuit board comprises a plurality of carrying units arranged in a matrix form, each of which comprises a plurality of input pads on the first surface and a plurality of output pads on the second surface, where the input pads and the output pads are interconnected electrically;
    mounting the pre-packaged panel on the first surface of the circuit board to form a plurality of package units arranged in a matrix form, where the integrating units of the pre-packaged panel one-to-one correspond to the carrying units of the circuit board, and the first metal bumps of the pre-packaged panel and the input pads on the first surface of the circuit board are respectively soldered together;
    forming a filling layer by filling a space between the first surface of the circuit board and the pre-packaged panel;
    forming second metal bumps on the output pads on the second surface of the circuit board; and
    cutting the structure based on the plurality of package units to form a plurality of independent package structures.

2. The method according to claim 1, wherein forming the pre-packaged panel comprises: providing a substrate on which a gluing layer is disposed, where the gluing layer comprises a plurality of gluing regions arranged in a matrix form; providing a plurality of semiconductor chips with the first pads; gluing a surface comprising the first pads of at least one semiconductor chip on each of the gluing regions in the gluing layer; forming a first encapsulation layer encapsulating the plurality of semiconductor chips; removing the substrate and the gluing layer so as to expose the first pads of the semiconductor chips; forming first metal bumps on the first pads, and thus, the plurality of integrating units arranged in a matrix form are formed.

3. The method according to claim 2, wherein, posterior to removing the substrate and the gluing layer, an integrating layer is formed on the first encapsulation layer, which comprises an input end, an output end and a multi-layer wire electrically connecting the input end and the output end, where the input end is electrically connected to one of the first pads of the semiconductor chip, and one of the first metal bumps is disposed on the output end.

4. The method according to claim 3, wherein each of the integrating units in the pre-packaged panel comprises a plurality of passive components, where each of the passive components comprises a second pad, and a surface comprising the second pad of one of the passive components is glued on the gluing layer.

5. The method according to claim 4, wherein the second pad of one of the passive components is electrically connected to the input end of the integrating layer.

6. The method according to claim 1, wherein the circuit board is a printed circuit board, a BT resin substrate or a silicon substrate.

7. The method according to claim 1, wherein a plurality of first through holes are formed, each of which is disposed between two neighboring integrating units of the pre-packaged panel and penetrates the first encapsulation layer, and the filling layer also fills the first through holes.

8. The method according to claim 1, wherein a plurality of second through holes are formed, each of which is disposed between two neighboring carrying units of the circuit board and penetrates the circuit board, and the filling layer also fills the second through holes.

9. The method according to claim 1, wherein each of the first metal bumps is a solder ball or a solder column, or each of the first metal bumps comprises a metal column and a solder ball on top of the metal column.

10. The method according to claim 1, further comprising:
    forming a second encapsulation layer encapsulating the pre-packaged panel, the circuit board and the filling layer, where the second metal bumps disposed on the output pads on the second surface of the circuit board are exposed by the second encapsulation layer.

* * * * *